Dec. 6, 1960

D. E. DUNWOODIE 2,963,659

SQUARE WAVE GENERATOR

Filed May 13, 1958

INVENTOR
DUANE E. DUNWOODIE
BY J. C. Chapman
ATTORNEY

United States Patent Office 2,963,659
Patented Dec. 6, 1960

2,963,659

SQUARE WAVE GENERATOR

Duane E. Dunwoodie, Palo Alto, Calif., assignor to Hewlett-Packard Company, Palo Alto, Calif., a corporation of California Filed May 13, 1958, Ser. No. 734,952

2 Claims. (Cl. 331—130)

This invention relates to electrical circuits to generate square waves of known amplitude. Circuits of this type are used, for instance, to calibrate oscilloscopes.

Square waves of specified amplitude are usually generated by successive clipping and amplification of a sine wave, or by clipping a wave produced by a multivibrator. In either case relatively expensive tubes or transistors are required. In oscilloscopes square waves are sometimes generated by clipping sixty-cycle sine waves obtained directly from the power transformer. This does result in a saving in tubes, but does lead in most instances to objectionable flicker of the square wave on the oscilloscope screen.

It is the principal object of this invention to provide an inexpensive square-wave generator which does not use either tubes or transistors, and which can produce a square-wave the repetition rate of which is not tied to that of the power supply.

In accordance with the illustrated embodiments of this invention, there is provided a square-wave generator comprising a pair of diodes each having a voltage differential between a breakdown voltage above which the diodes conduct, and a holding voltage below which the diodes stop conducting. These diodes are made to conduct alternately, and the square-wave is derived from the current passed through one of the diodes.

Other and incidental objects of this invention will be apparent to those skilled in the art from a reading of this specification and an inspection of the accompanying drawing in which.

Figure 1:
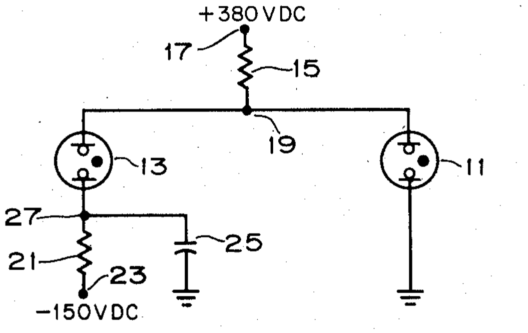
Figure 1 is a circuit diagram useful in explaining the operation of this invention.

Referring now to Figure 1 there are shown a pair of diodes 11 and 13, each having a voltage differential between a breakdown voltage above which the diodes will start conducting when they are in a non-conducting state, and a holding voltage below which the diodes will stop conducting when they are in a conducting state. The diodes shown in this circuit are gas-filled tubes such as neon lamps having a breakdown voltage of approximately 80 volts and a holding voltage of approximately 60 volts. The diode 11 is connected in series with a resistor 15 between a +380 volts power supply terminal 17 and ground. One terminal of the diode 13 is connected to the junction 19 of the resistor 15 and of the diode 11, while the other terminal of the diode 13 is connected through a resistor 21 to a −150 volts power supply terminal. A capacitor 25 is connected between ground and the junction 27 of diode 13 and resistor 21. This capacitor is in parallel with at least part of the resistor 21.

Figure 2:
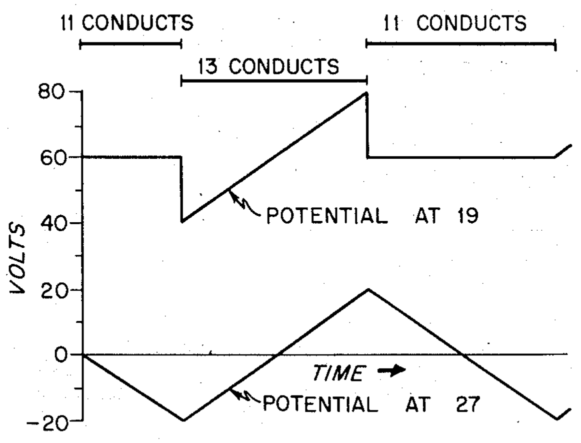
Figure 2 is a graph showing the variations of the voltages at certain points in the circuit of Figure 1.

The operation of the circuit of Figure 1 will be explained with reference to the graphs shown in Figure 2. Let us assume that the diode 11 is conducting and the diode 13 is non-conducting. In this case the potential at junction 19 is determined by the holding voltage of the diode 11 and is therefore at +60 volts. The capacitor 25 starts charging through resistor 21 and the potential at junction 27 goes down towards minus 150 volts. When the potential at junction 27 reaches minus 20 volts the voltage across the diode 13 reaches its breakdown voltage and the diode 13 conducts. At the instant diode 13 conducts the potential at junction 19 drops to a point where it is above the potential at junction 27 by an amount equal to the holding voltage of the diode 13. Since at that instant the potential at junction 27 is −20 volts the potential at junction 19 drops suddenly from +60 volts to +40 volts. We now have only 40 volts across the diode 11 the holding voltage of which is 60 volts and, therefore, the diode 11 stops conducting suddenly.

We now have diode 13 conducting and diode 11 non-conducting. With diode 13 conducting the capacitor 25 starts charging in a positive direction through diode 13 and resistor 15, the charging current through diode 13 and resistor 15 being greater than the charging current through resistor 21. The potential at junction 27 therefore rises, and the potential at junction 19 rises with it since it is held above that of junction 27 by an amount equal to the holding voltage of diode 13, namely 60 volts. When the potential at junction 19 rises to the breakdown voltage of the diode 11 (i.e. +80 volts) diode 11 conducts and the potential across diode 11 suddenly drops to its holding voltage i.e. 60 volts. The sudden drop of the potential at junction 19 leaves only 40 volts across the diode 13 which stops conducting. When diode 13 stops conducting the capacitor 25 starts charging in a negative direction through the resistor 21 until the potential across the diode 13 reaches its breakdown potential and the cycle is repeated.

Figure 3:
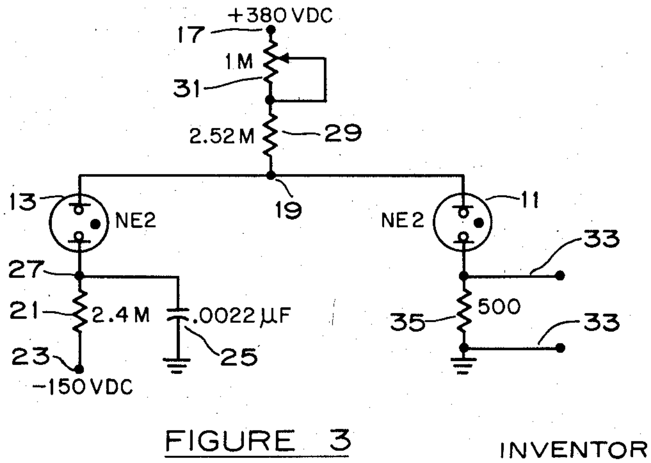
Figure 3 is a circuit diagram of a practical embodiment of this invention.

Reference is now made to Figure 3 which shows a practical embodiment of a square-wave generator in accordance with this invention. Here the resistor 15 is replaced by a fixed resistor 29 and a variable resistor 31 which may be used to adjust the magnitude of the square-wave which is generated. The square-wave is derived from on-off current passed through the diode 11 and is obtained by means of output leads 33 across a load resistor 35 connected in series between the diode 11 and ground. The resistance of resistor 35, which is chosen so that the voltage across it is a small fraction of the voltage differential across diode 11, is small compared to the sum of the resistors 29 and 31 connected between the diode 11 and the power supply terminal 17. Its presence in the circuit, therefore, has practically no effect on its operation as described in connection with the circuit of Figure 1.

Applicant has thus provided a simple and inexpensive generator of square-waves which are referenced to ground. The magnitude of the square-waves can be adjusted by adjusting resistor 31, and their repetition rate is controlled by the values of the resistance-capacitance network comprising resistor 21 and capacitor 25, and by the value of resistors 29 and 31.

I claim:

1. A square-wave generator comprising two diodes each having a voltage differential between a breakdown voltage and a holding voltage, a first resistance, a second resistance the value of which is a small fraction of that of the first resistance, means to connect one of said diodes in series between said first and second resistances to form a series circuit, means to connect said series circuit across a steady voltage of sufficient magnitude to break down said first diode, a resistance-capacitance network comprising a third resistance and a capacitance in shunt with at least part of said third resistance, means including said second diode to connect said network to the junction of said first resistance and of said first diode, means to apply to the terminal of said third resistance remote from said second diode a potential of such magnitude and polarity that when said second diode is not conducting the charging of said capacitance through said third resistance will cause the second diode to conduct, the conduction of said second diode causing said first diode to stop conducting and said capacitance to charge through said second diode and said first resistor, the charge of said capacitance causing said first diode to conduct, the conduction through said first diode causing said second diode to stop conducting, and output means connected across the second resistance.

2. A square-wave generator comprising two gas-filled tubes each having a voltage differential between a breakdown voltage and a holding voltage, a first resistance, a second resistance the value of which is a small fraction of that of the first resistance, means to connect one of said gas-filled tubes in series between said first and second resistances to form a series circuit, means to connect said series circuit across a steady voltage of sufficient magnitude to break down said first gas-filled tube, a resistance-capacitance network comprising a third resistance and a capacitance in shunt with at least part of said third resistance, means including said second gas-filled tube to connect said network to the junction of said first resistance and of said first gas-filled tube, means to apply to the terminal of said third resistance remote from said second gas-filled tube a potential of such magnitude and polarity that when said second gas-filled tube is not conducting the charging of said capacitance through said third resistance will cause the second gas-filled tube to conduct, the conduction of said second gas-filled tube causing said first gas-filled tube to stop conducting and said capacitance to charge through said second gas-filled tube and said first resistor, the charge of said capacitance causing said first gas-filled tube to conduct, the conduction through said first gas-filled tube causing said second gas-filled tube to stop conducting, and output means connected across the second resistance.

References Cited in the file of this patent

UNITED STATES PATENTS

| | | |
|---|---|---|
| 2,140,840 | Langer | Dec. 20, 1938 |
| 2,310,328 | Swift | Feb. 9, 1943 |
| 2,714,162 | Six et al. | July 26, 1955 |

FOREIGN PATENTS

| | | |
|---|---|---|
| 166,800 | Australia | Feb. 6, 1956 |